United States Patent [19]
Kato et al.

[11] Patent Number: 4,814,716
[45] Date of Patent: Mar. 21, 1989

[54] APPARATUS FOR PRODUCING AND ACCELERATING AN ELECTRON BEAM

[75] Inventors: Shoji Kato; Takeshi Tomita, both of Tokyo, Japan

[73] Assignee: Jeol Ltd., Tokyo, Japan

[21] Appl. No.: 99,550

[22] Filed: Sep. 22, 1987

[30] Foreign Application Priority Data

Sep. 26, 1986 [JP] Japan .................... 61-228624

[51] Int. Cl.$^4$ ............................ H05H 5/00
[52] U.S. Cl. ................................ 328/233
[58] Field of Search ............... 313/360.1; 328/233

[56] References Cited

U.S. PATENT DOCUMENTS

| | | | |
|---|---|---|---|
| 3,946,268 | 3/1976 | Welter | 315/31 R |
| 4,160,905 | 7/1979 | Davey | 250/311 |
| 4,383,180 | 5/1983 | Turner | 328/233 X |

OTHER PUBLICATIONS

Edited by T. Imura, S. Maruse and T. Suzuki, *Electron Microscope 1986*, Proceedings of The XITH International Congress on Electron Microscopy held in Kyoto, Japan, Aug. 31–Sep. 7, 1986, Journal of Electron Microscopy, vol. 35, Supplement (1986), pp. 265–266.

*Primary Examiner*—Palmer C. DeMeo
*Attorney, Agent, or Firm*—Webb, Burden, Ziesenheim & Webb

[57] ABSTRACT

In a conventional electron beam-producing apparatus, a field emission gun is combined with an accelerating tube. An electrostatic lens focuses the electron beam diverging from the emitter. This conventional apparatus needs a large power supply for applying potentials to the electrodes of the lens and to the accelerating electrodes. Also, it is difficult to make stationary the position at which the crossover point of the electron beam is imaged. The present invention makes use of voltage-dividing resistors to produce fractions of the accelerating voltage. These fractions of the voltage are applied to the electrodes of the electrostatic lens and to various electrodes. This permits the use of a power supply that is smaller in size than conventional. The number of the used voltage-dividing resistors is increased or decreased, depending on the accelerating voltage. This makes it possible to fix the position of the crossover point imaged by the electrostatic lens.

4 Claims, 4 Drawing Sheets

APPARATUS FOR PRODUCING AND ACCELERATING AN ELECTRON BEAM

FIELD OF THE INVENTION

The present invention relates to an improved electron beam-producing apparatus which has a plurality of electrostatic electrodes for accelerating and focusing the electron beam diverging from a field emission gun.

BACKGROUND OF THE INVENTION

Field emission guns have much higher brightness than thermionic electron guns which have been employed for many years. Therefore, when a field emission gun is used in an electron microscope or other instrument utilizing an electron beam, the performance of the instrument is greatly enhanced.

A conventional field emission gun is shown in FIG. 1, where a hairpin filament 2 is mounted in an evacuated vessel 1. The gun includes a needle-like emitter 3 spot-welded to the filament 2, a first control electrode 4 (also known as an extraction electrode), and a second control electrode 5. An accelerating voltage source 6 produces an output voltage $V_0$ that is applied between the emitter 3 and the second control electrode 5. Since the second control electrode 5 is usually maintained at ground potential, the emitter 3 is held at a high negative potential. The output voltage $V_0$ is the accelerating voltage of the gun. An extracting voltage source 7 generates a voltage $V_1$ that is applied between the emitter 3 and the first control electrode 4, in order to create a potential difference for inducing field emission at the tip of the emitter 3. The opposing surfaces of the first control electrode 4 and the second control electrode 5 are so machined that they form a Butler electrostatic lens for focusing the electron beam 9 along the optical axis 8 of the electron optics. This electrostatic lens focuses the electron beam which diverges from a virtual electron beam-emitting point, known as a crossover point, formed near the tip of the emitter. The electrostatic lens forms an image of the crossover point at a point P lying on the optical axis 8. Let $S_1$ be the distance between the emitter 3 and the first control electrode 4, d be the distance between the first control electrode 4 and the second control electrode 5, and $S_2$ be the distance between the second control electrode 5 and the point P at which the image of the crossover point is formed.

In FIG. 2, $S_2/d$ is plotted against $V_0/V_1$, and in which $S_1/d$ is a parameter. The vertical axis of the graph, or $S_2/d$, is the distance $S_2$ normalized by the distance d, while the horizontal axis, or $V_0/V_1$, is the ratio of the voltage $V_0$ to the voltage $V_1$. The parameter $S_1/d$ is the distance $S_1$ normalized by the distance d. It can be seen from the graph of FIG. 2 that when the accelerating voltage $V_0$ is varied, the position P of the crossover point image shifts.

When the position P moves, the path followed by the electron beam in the electron optical system varies and so various adjustments are necessary. For example, in a scanning-type electron microscope or the like, it is often necessary to vary the voltage for accelerating the electron beam, depending on the kind of the specimen to be observed. If the position P is shifted when the accelerating voltage is changed, then the observed image that is obtained while a scan is being made is defocused, or the brightness is greatly changed. As a result, it is necessary to readjust the excitation of each electron lens in the electron optical system.

FIG. 3 shows one example of an apparatus which is designed to prevent the position P of the crossover point image from shifting. This apparatus uses a first control electrode 10, a second control electrode 11, and a third control electrode 12. In the apparatus shown in FIG. 1, the first control electrode 4 acts as an extraction electrode for placing the tip of the emitter in a strong electric field. The electrode 4 also serves as one electrode of an electrostatic lens. On the other hand, the second control electrode 10 and the third control electrode 11 shown in FIG. 3 act only as the electrodes of an electrostatic lens. The apparatus shown in FIG. 3 further includes an extraction voltage source 7 for creating a potential difference between the emitter 3 and the first control electrode 10, and an accelerating voltage source 6 for creating a potential difference between the emitter 3 and the third control electrode 12. It is necessary to provide a first lens voltage source 13 for creating a potential difference of $V_2$ between the emitter 3 and the second control electrode 11. This structure permits the magnitude of the electrostatic lens to be changed while the extraction voltage $V_1$ is maintained constant. Therefore, when the accelerating voltage $V_0$ is varied, the magnitude of the electrostatic lens is adjusted by changing the potential $V_2$ applied between the emitter 3 and the second control electrode 11. Thus, the position P of the crossover point image is prevented from shifting. As an example, a potential of $-100$ KV, a potential of $-100$ to $-90$ KV, and a potential of about $-100$ KV are applied to the emitter, the first control electrode, and the second control electrode, respectively.

The apparatus shown in FIG. 3 can be used in an apparatus where an electron beam is accelerated by a voltage less than about 100 KV but it cannot be employed as it is in an apparatus using an acceleration voltage of about 200 KV or more, since it is difficult to create a potential difference of about 100 KV or more either between the second control electrode 11 and the third control electrode 12 which form an electrostatic lens or between the first control electrode 10 and the second control electrode 11 because of the possibility of electric discharge or other phenomenon. These techniques are disclosed in U.S. Pat. No. 3,946,268.

In an attempt to solve these problems, an apparatus shown in FIG. 4 has been proposed. This apparatus includes an accelerating voltage source 14 which can produce up to 200 KV. An outside vessel 16 is mounted around the side wall 15 of an evacuated vessel 1. The side wall 15 consists of a cylinder made of an insulating material. The space between the outside vessel 1 and the cylindrical side wall 15 is filled with an insulating gas, such as Freon gas. This insulating gas maintains the insulation between the terminals mounted outside the insulating side wall 15. A first control electrode 10, a second control electrode 11, and a third control electrode 12 are disposed inside the evacuated vessel 1 in the same manner as in the apparatus shown in FIG. 3. However, the third electrode 12 is kept not at ground potential but at about $-140$ KV by the output $V_3$ from a second lens voltage source 17. Five accelerating electrodes 18a, 18b, 18c, 18d, and 18e are mounted below the third electrode 12 and supplied with potentials of $-125$ KV, $-100$ KV, $-75$ KV, $-50$ KV, and $-25$ KV, respectively, for example, via voltage-dividing resistors 19a, 19b, 19c, 19d, 19e, and 19f which are connected in series between the output of the accelerating voltage source 14 and ground potential. These techniques are disclosed in U.S. Pat. No. 4,160,905. These accelerating electrodes have holes through which the electron beam passes. Since the diameter of these holes is much larger than the diameter of the hole formed in the second control electrode 11 in the same way as the first control electrode 10, the effects of the electrostatic lens formed by the accelerating electrodes on the electron beam can be almost neglected.

In the apparatus shown in FIG. 4, the ratio of the potential at the second control electrode 11 with respect to the emitter to the potential at the third control electrode 12 with respect to the emitter is kept constant. Therefore, as can be seen from the description made in connection with FIG. 2, the position of the crossover point image is prevented from shifting irrespective of changes in the accelerating voltage. However, this apparatus needs the second lens voltage source 17 between the emitter 3 and the third control electrode 12, unlike the apparatus shown in FIG. 3. The output voltage from the second lens voltage source 17 is considerably higher than the output, of the order of 10 KV, from the emitter voltage source. This makes the voltage sources of the instrument bulky and complex.

The electrodes of the electron gun are connected with the voltage sources by an insulated cable 20. Since the potential at a core 21 connected with the third control electrode 12 differs from the potential at the other cores by as much as 60 KV, the diameter of the cable 20 is very large. This renders the apparatus larger.

Field-dispersing rings 22a, 22b, 22c, 22d, and 22e which are mounted outside the accelerating electrodes, respectively, are kept at the same potentials as their respective accelerating electrodes mounted inside the evacuated vessel. These rings act to prevent the electric field distribution inside the outside vessel 16 from concentrating at certain locations.

SUMMARY OF THE INVENTION

It is a main object of the invention to provide an electron beam-producing apparatus in which a field emission gun is combined with a multi-stage accelerating tube, and in which the position of the crossover point image formed by the emission gun does not shift irrespective of changes in the accelerating voltage.

It is another object of the invention to provide an electron beam-producing apparatus which has a simple power supply and in which a field emission gun is combined with a multi-stage accelerating tube.

It is a further object of the invention to provide an electron beam-producing apparatus in which a field emission gun is combined with a multi-stage accelerating tube, and in which the power supply is connected with the gun electrodes by a simple cable.

In an apparatus having a field emission gun combined with an accelerating tube in accordance with the invention, various voltages to be applied to electrostatic lens electrodes and other electrodes are obtained from the voltage for accelerating the electron beam, by the use of voltage-dividing resistors. Thus, the power supply can be made small. The position of the crossover point image created by the electrostatic lens can be prevented from shifting by increasing or decreasing the number of the used voltage-dividing resistors, according to the accelerating voltage.

DESCRIPTION OF THE PREFERRED EMBODIMENT

Figure 5:
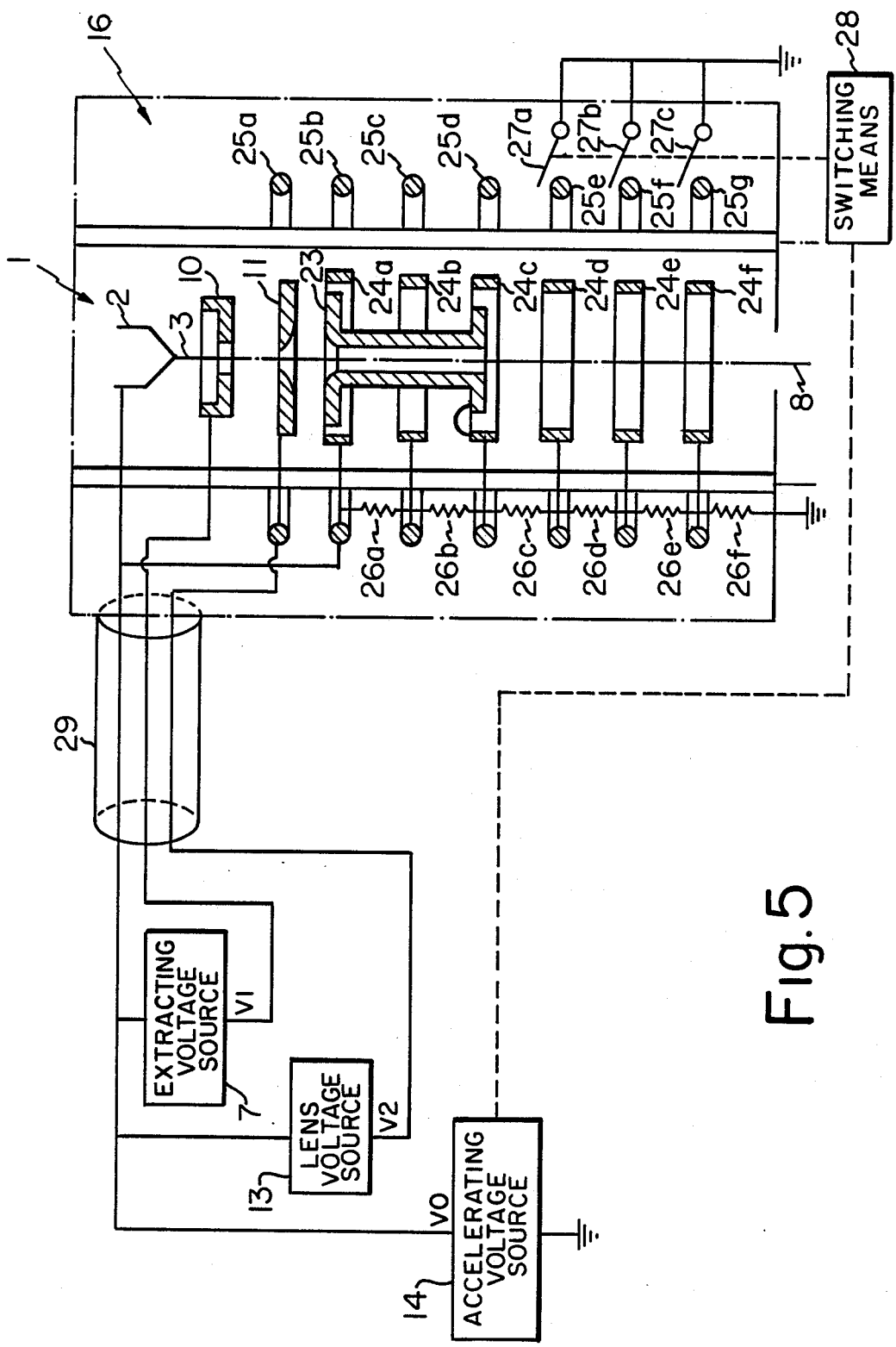
FIG. 5 is a schematic diagram of an electron beam-producing apparatus according to the invention.

Referring to FIG. 5, there is shown an electron beam-producing apparatus embodying the concept of the invention. It is to be noted that like reference numerals indicate like components throughout all the figures. This apparatus includes six stages of accelerating electrodes 24a, 24b, 24c, 24d, 24e, and 24f. Six voltage-dividing resistors 26a, 26b, 26c, 26d, 26e and 26f are connected in series between the output of the accelerating voltage source 14 and ground potential to apply voltages to the electrodes 24a–24f, respectively. The third control electrode 23 has a disk-like electrode and a cylindrical portion which is connected to the rear side of the disk-like electrode. The surface of this disk-like electrode which faces the second control electrode 11 is so curved that a Butler electrostatic lens is formed between them. The cylindrical portion of the third control electrode 23 is electrically connected with the accelerating electrode 24c so that the electrode 23 may be placed at the same potential as the accelerating electrode 24c. The third control electrode 23 is disposed inside the accelerating electrodes 24a, 24b and 24c. These three electrodes do not act to accelerate the electron beam but serve to uniformize the electric field distribution inside the evacuated vessel.

Figure 4:
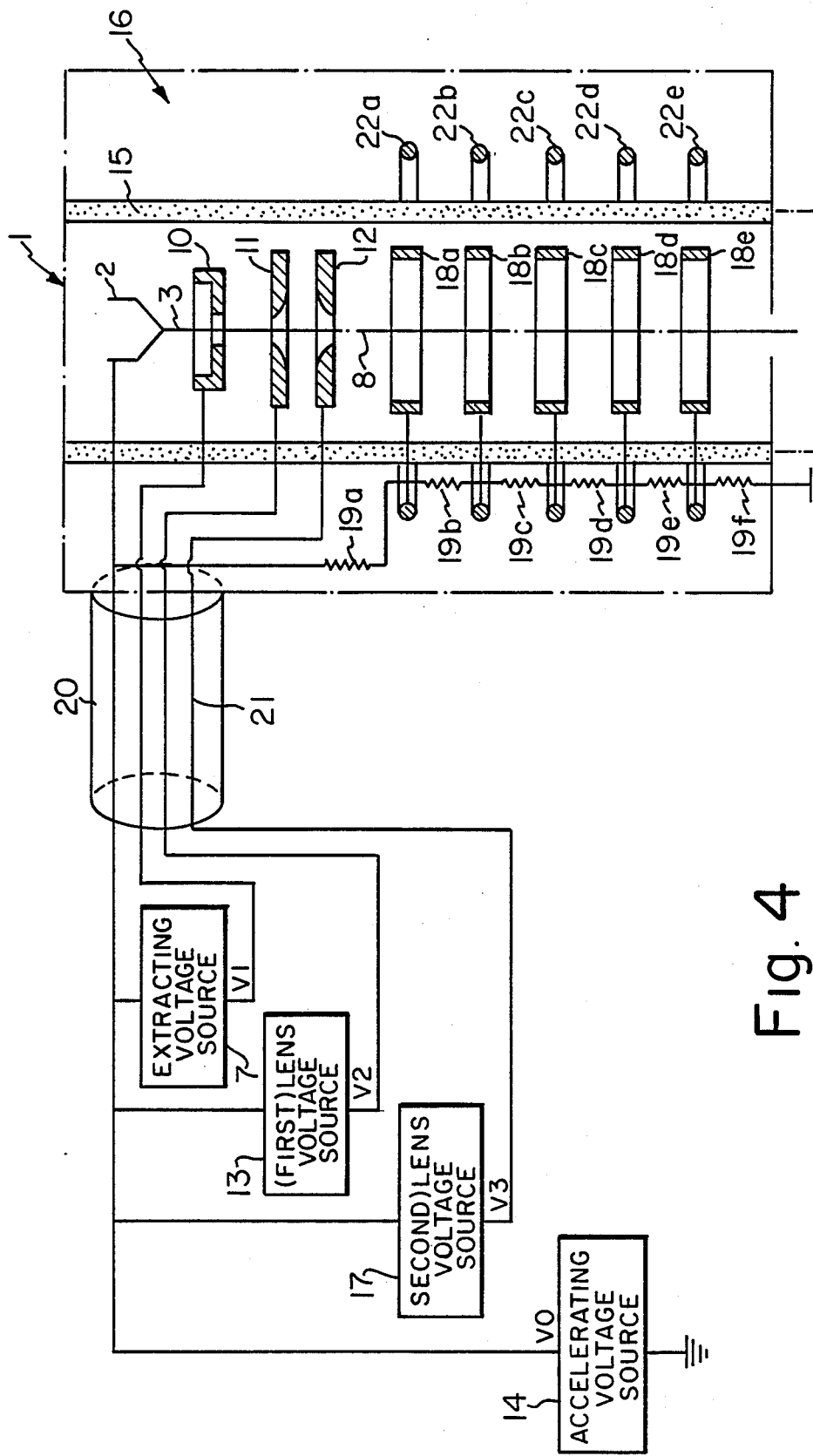
FIG. 4 is a schematic diagram of a further conventional field emission gun.

The uppermost ring 25a of seven field-dispersing rings 25a, 25b, 25c, 25d 25e, 25f, and 25g is at the same potential as the second control electrode 11. The other rings 25b–25g are at the same potentials as their adjacent accelerating electrodes. The three lower rings 25e, 25f, and 25g are equipped with grounding means 27a, 27b, and 27c, respectively, to ground them. The operation of each grounding means is controlled by a switching means 28 which is controlled in synchronism with an operation for switching the output from the accelerating voltage source 14 changing the output voltage of the accelerating voltage source 14. No separate voltage source is required for applying a potential to the third control electrode 23, unlike the apparatus shown in FIG. 4. Therefore, the power supply of the apparatus is made simple. Also, the number of cores of a cable 29 which connects the electrodes of the gun with the voltage sources is reduced. Further, the cable is only required to withstand lower voltages. Hence, an inexpensive cable can be used as the cable 29.

Usually, the potential at the first control electrode 10 with respect to the emitter is kept at about +2 to +5 KV and not increased beyond +10 KV. The second control electrode 11 is kept either at substantially the same potential as the first control electrode 10 or at a potential higher than the first electrode 10 by about +2 KV. Accordingly, we assume now that the first control electrode 10 is maintained at a potential higher than the emitter by +10 KV.

Let us assume that the accelerating voltage source 14 produces its maximum value of −200 KV. At this time, none of the three grounding means are connected to the circuit. The voltage between neighboring accelerating electrodes is approximately 33 (=200/6) KV. The potential at the third control electrode 23 is −133 KV. The potential at the accelerating electrode 24d is −100 KV. The potential at the accelerating electrode 24e is −67 KV. The potential at the accelerating electrode 24f is −33 KV.

When the output from the accelerating voltage source 14 is switched to −160 KV, the switching means 28 connects the grounding means 27c to the circuit. Under this condition, the voltage between neighboring accelerating electrodes is approximately 32 (=160/5) KV. As a result, the potentials at the third control electrode 23, the accelerating electrode 24d, the accelerating electrode 24e are −96 KV, −64 KV, and −32 KV, respectively.

When the output from the accelerating voltage source 14 is switched to −120 KV, the switching means 28 connects the grounding means 27b and 27c to the circuit. In this state, the voltage between neighboring accelerating electrodes is approximately 30 (=120/4) KV. As a result, the potentials at the third control electrode 23 and the accelerating electrode 24d are −60 KV and −30 KV, respectively.

When the output from the accelerating voltage source 14 is switched to −100 KV, the switching means 28 connects all of the three grounding means to the circuit. The voltage between neighboring accelerating electrodes is approximately 33 (=100/3) KV. As a result, the potentials at the third control electrode 23 and the accelerating electrode 24d are −67 KV and −33 KV, respectively. The accelerating electrode 24d and the succeeding electrodes are at ground potential.

Figure 1:
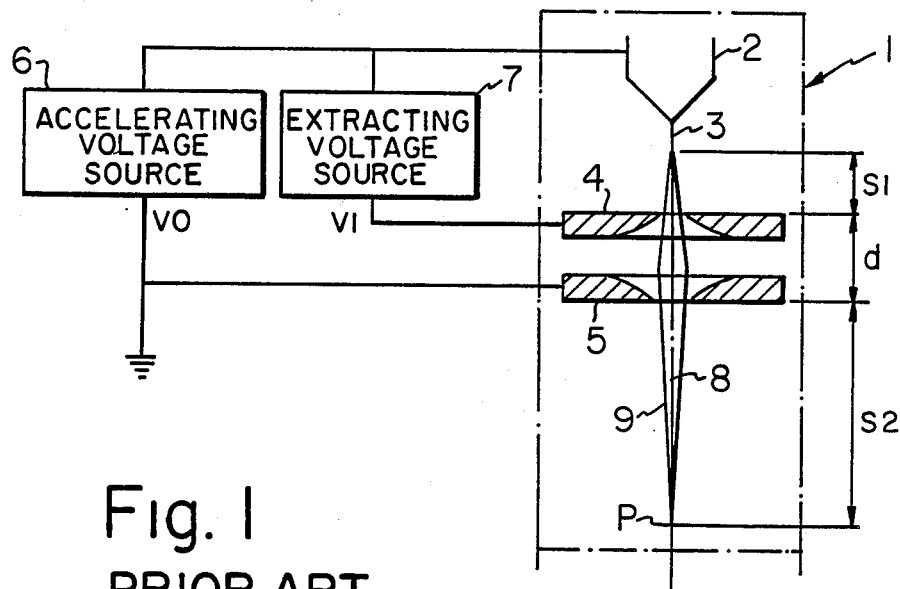
FIG. 1 is a schematic diagram of a conventional field emission gun.
Figure 3:
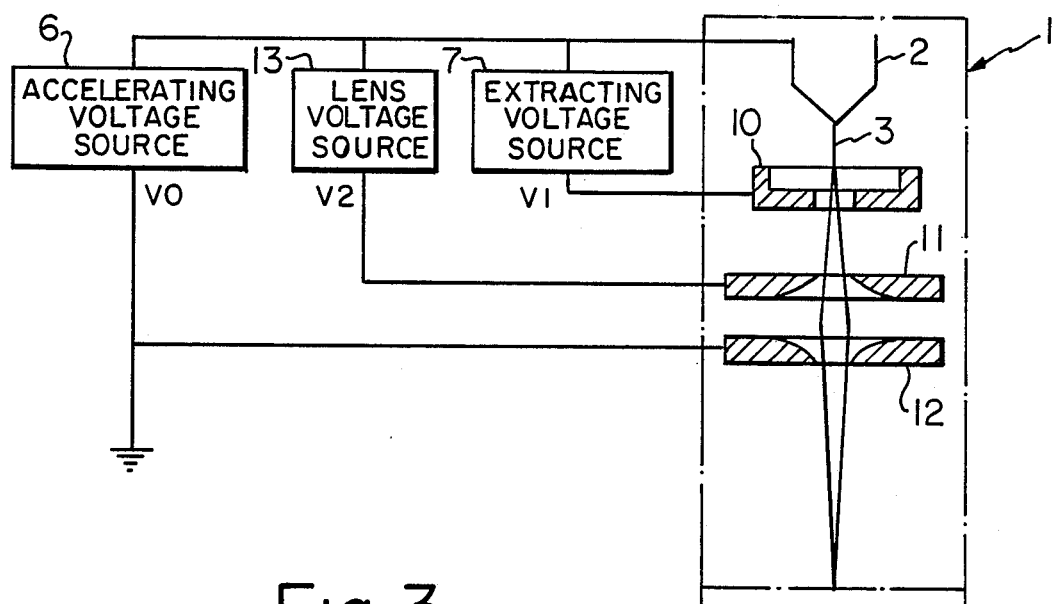
FIG. 3 is a schematic diagram of another conventional field emission gun.
Figure 2:
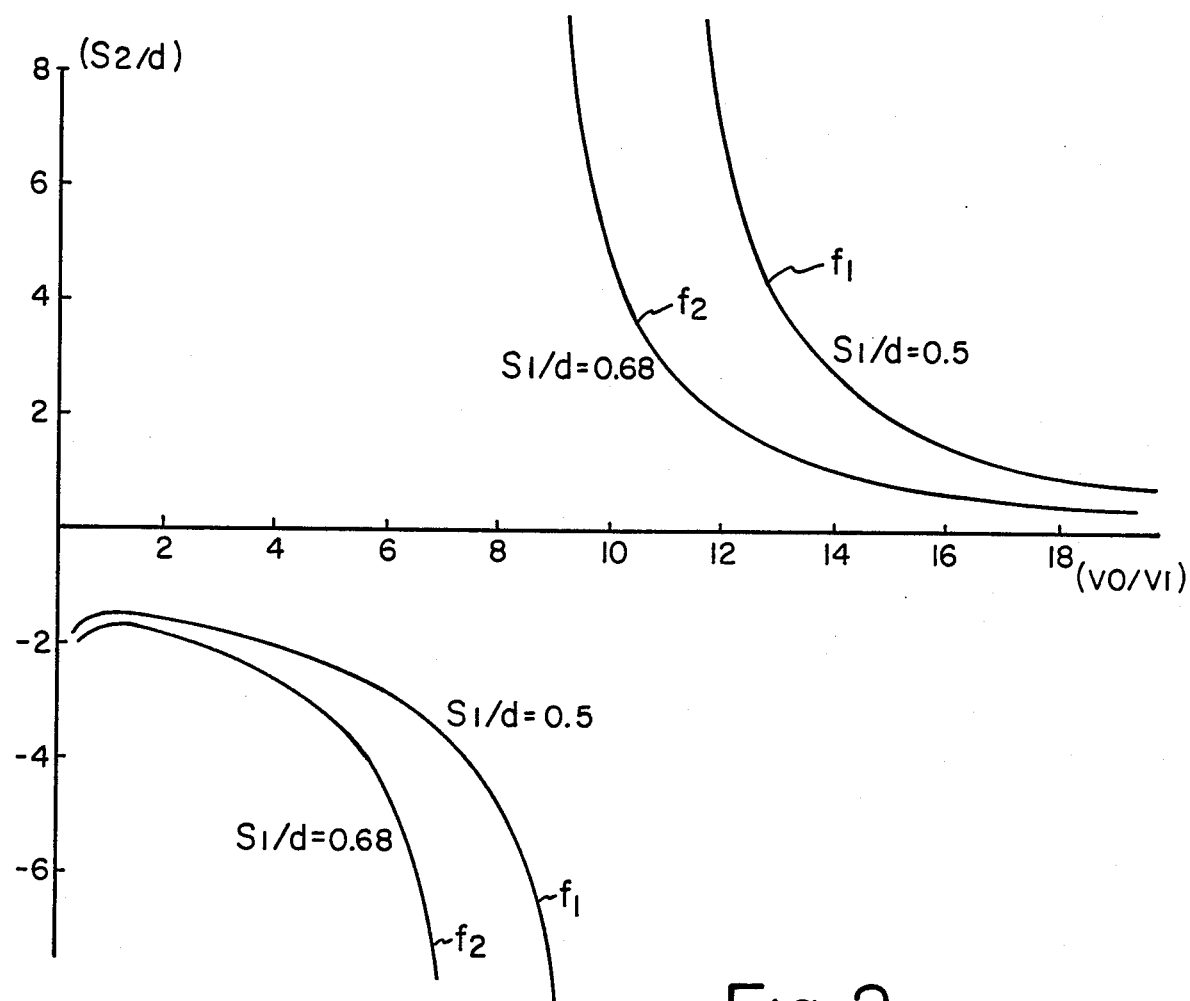
FIG. 2 is a graph showing the relation between the position of a crossover point image created by the gun shown in FIG. 1 and the potentials at the electrodes of the gun.

In any case, the potential difference between the emitter and the second control electrode 11 is kept at 10 KV, and the potential difference between the emitter and the third control electrode 23 is held at 60 to 67 KV. Therefore, as already described in connection with FIG. 2, the image of the crossover point can be maintained substantially at the optimum position which was set by the designer of the instrument. In this way, the main object of the invention is accomplished.

In some field emission guns, the emitter is heated at all times. In the other field emission guns, the emitter is not usually heated. The present invention can be applied to both kinds of field emission guns.

Having thus described our invention with the detail and particularity required by the Patent Laws, what is claimed and desired to be protected by Letters Patent is set forth in the following claims.

What is claimed is:

1. In an electron beam-producing apparatus for generating an electron beam along an electron-optical axis having an accelerating voltage source whose output can be switched between very different values, an emitter receiving the output potential from the accelerating voltage source, a first control electrode disposed adjacent to the emitter, an extraction voltage source for creating a potential difference between the emitter and the first control electrode to induce electric field emission at the tip of the emitter, a second control electrode disposed a larger distance along the electron optical axis from the emitter than the first control electrode and acting as one electrode of an electrostatic lens for focusing the electron beam diverging from the emitter, a lens voltage source for creating a potential difference between the emitter and the second control electrode, a third control electrode disposed a larger distance along the electron optical axis from the emitter than the second control electrode and acting as the other electrode of the electrostatic lens, said third control electrode being put at a potential differing from the potential at the emitter by a certain constant value, and a plurality of accelerating electrodes for successively accelerating the electron beam passed through the third control electrode,, the improvement comprising:

a plurality of voltage-dividing resistors connected in series between the output of the accelerating voltage source and ground potential, for causing fractions of the output from the accelerating voltage source to be applied to the third control electrode and the accelerating electrodes; and a switching means for grounding selected one or more of the accelerating electrodes at which the fractions of the output from the accelerating voltage source appear, the switching means being individually controllable whereby the potential difference between the emitter and the third control electrode is maintained substantially constant irrespective of changes in the output from the accelerating voltage source.

2. In an electron beam-producing apparatus as set forth in claim 1, the further improvement comprising a plurality of field-dispersing rings for uniformizing the electric field distribution near an electrical insulating mechanism that mechanically holds the second control electrode, the third control electrode, and the accelerating electrodes, and wherein the fractions of the output from the accelerating voltage sources that are obtained by the voltage-dividing resistors are applied to the rings.

3. In an electron beam-producing apparatus as set forth in claim 1, the further improvement wherein the operation of said switching means is controlled in synchronism with an operation for switching the output from the accelerating voltage source to a different value.

4. In an electron beam-producing apparatus as set forth in claim 1, the further improvement wherein the electrostatic lens formed by the second and third control electrodes is of the Butler type.

* * * * *

UNITED STATES PATENT AND TRADEMARK OFFICE
CERTIFICATE OF CORRECTION

PATENT NO. : 4,814,716

DATED : March 21, 1989

INVENTOR(S) : Shoji Kato and Takeshi Tomita

It is certified that error appears in the above-identified patent and that said Letters Patent is hereby corrected as shown below:

Column 2 Line 53 "1" should read --16--.

Column 2 Line 65 "!2" should read --12--.

Claim 1 Column 6 Line 22 after "electrode"
delete --,--. (first occurrence)

Signed and Sealed this

Seventh Day of November, 1989

*Attest:*

JEFFREY M. SAMUELS

*Attesting Officer*    *Acting Commissioner of Patents and Trademarks*